US012610751B2

(12) United States Patent
Philip et al.

(10) Patent No.: US 12,610,751 B2
(45) Date of Patent: Apr. 21, 2026

(54) LATERAL PHASE CHANGE MEMORY CELL

(71) Applicant: INTERNATIONAL BUSINESS MACHINES CORPORATION, Armonk, NY (US)

(72) Inventors: Timothy Mathew Philip, Albany, NY (US); Jin Ping Han, Yorktown Heights, NY (US); Ching-Tzu Chen, Ossining, NY (US); Kevin W. Brew, Niskayuna, NY (US); Injo Ok, Loudonville, NY (US)

(73) Assignee: International Business Machines Corporation, Armonk, NY (US)

( * ) Notice: Subject to any disclaimer, the term of this patent is extended or adjusted under 35 U.S.C. 154(b) by 1063 days.

(21) Appl. No.: 17/656,430

(22) Filed: Mar. 25, 2022

(65) Prior Publication Data

US 2023/0309425 A1 Sep. 28, 2023

(51) Int. Cl.
*H10N 70/00* (2023.01)
*H10N 70/20* (2023.01)

(52) U.S. Cl.
CPC ......... *H10N 70/823* (2023.02); *H10N 70/011* (2023.02); *H10N 70/231* (2023.02); *H10N 70/841* (2023.02)

(58) Field of Classification Search
None
See application file for complete search history.

(56) References Cited

U.S. PATENT DOCUMENTS

| | | | |
|---|---|---|---|
| 6,764,894 B2 * | 7/2004 | Lowrey | H10N 70/8828 438/386 |
| 6,867,425 B2 | 3/2005 | Wicker | |
| 7,012,273 B2 * | 3/2006 | Chen | H10N 70/231 257/296 |
| 7,161,167 B2 * | 1/2007 | Johnson | H10N 70/8828 365/105 |

(Continued)

FOREIGN PATENT DOCUMENTS

| | | |
|---|---|---|
| CN | 101661992 B | 3/2010 |
| CN | 111146339 A | 5/2020 |
| CN | 111969106 A | 11/2020 |

OTHER PUBLICATIONS

Burr et al., "Recent Progress in Phase-Change Memory Technology", IEEE Journal on Emerging and Selected Topics in Circuits and Systems, vol. 6, No. 2, Jun. 2016, pp. 146-162.

(Continued)

*Primary Examiner* — Nishath Yasmeen
(74) *Attorney, Agent, or Firm* — Samuel A. Waldbaum

(57) ABSTRACT

A structure including an inner electrode and an outer electrode on a substrate and a phase change material layer, the phase change material layer vertically aligned above both the inner electrode and the outer electrode. A structure including an inner electrode and an outer electrode on a substrate and a phase change material layer, the phase change material layer vertically aligned above both the inner electrode and the outer electrode, where the inner electrode and the outer electrode are on the same horizontal plane. A method including forming an inner electrode and an outer (Continued)

100

Section A-A electrode simultaneously on a substrate, forming a phase change material layer above both the inner electrode and the outer electrode.

14 Claims, 10 Drawing Sheets

(56)                    References Cited

U.S. PATENT DOCUMENTS

| | | | |
|---|---|---|---|
| 7,459,717 B2 | 12/2008 | Lung | |
| 7,463,512 B2 | 12/2008 | Lung | |
| 7,598,113 B2 | 10/2009 | Chen | |
| 7,642,539 B2 | 1/2010 | Lung | |
| 7,670,869 B2 * | 3/2010 | Yu | H10N 70/068 |
| | | | 257/4 |
| 7,732,801 B2 | 6/2010 | Chen | |
| 7,786,461 B2 * | 8/2010 | Lung | H10B 63/30 |
| | | | 257/E45.002 |
| 7,816,660 B2 | 10/2010 | Dodge | |
| 7,851,887 B2 | 12/2010 | Son | |
| 7,923,712 B2 | 4/2011 | Arnold | |
| 8,426,838 B2 * | 4/2013 | Chen | H10N 70/8413 |
| | | | 257/295 |
| 8,735,865 B2 | 5/2014 | Minemura | |
| 9,082,954 B2 | 7/2015 | Lung | |
| 9,178,141 B2 * | 11/2015 | Liu | H10N 70/8828 |
| 9,337,421 B2 | 5/2016 | Chin | |
| 2005/0167656 A1 * | 8/2005 | Sun | H10N 70/8828 |
| | | | 257/30 |
| 2006/0278863 A1 * | 12/2006 | Chang | H10W 20/021 |
| | | | 257/E21.538 |
| 2007/0148855 A1 | 6/2007 | Chen et al. | |
| 2009/0212274 A1 | 8/2009 | Breitwisch | |
| 2010/0001253 A1 * | 1/2010 | Arnold | H10N 70/8828 |
| | | | 257/4 |
| 2010/0108977 A1 * | 5/2010 | Yoon | H10N 70/253 |
| | | | 257/E21.585 |
| 2014/0369113 A1 * | 12/2014 | Krebs | H10N 70/011 |
| | | | 365/163 |
| 2021/0091307 A1 * | 3/2021 | BrightSky | H10N 70/826 |

OTHER PUBLICATIONS

Sainon et al., "Comparison on the performance of the confined-chacogenide with thin metal interlayer and optimised lateral phase change memories", ©2011 IEEE, pp. 176-179.

* cited by examiner

Section A-A

Section A-A

Section A-A

Section A-A

Section B-B

Section B-B

300

320

306

322

B

D2

312

D2

308

304

314

B

W10

Section C-C

LATERAL PHASE CHANGE MEMORY CELL

BACKGROUND

The present invention relates generally to a phase change memory cell, and more particularly, to a lateral phase change memory cell.

A phase change memory cell may be used for data storage. The phase change memory cell is a non-volatile random-access memory. A typical configuration of a phase change memory cell may include a phase change material arranged between, and coupled to, at least two electrodes. When the phase change memory cell is in use, the phase change material may be operated in one of at least two reversibly transformable phases, an amorphous phase and a crystalline phase. The amorphous phase and the crystalline phase are distinct from one another. In the amorphous phase, the phase change material has a discernibly higher resistance when compared to the crystalline phase. In order to facilitate a phase transition, energy is supplied to the phase change material such as, for example, electrical energy, thermal energy, any other suitable form of energy or combination thereof that may effectuate a desired phase transition.

SUMMARY

According to an embodiment of the present invention, a structure is provided. The structure including an inner electrode and an outer electrode on a substrate and a phase change material layer, the phase change material layer vertically aligned above both the inner electrode and the outer electrode.

According to an embodiment of the present invention, a structure is provided. The structure including an inner electrode and an outer electrode on a substrate and a phase change material layer, the phase change material layer vertically aligned above both the inner electrode and the outer electrode, where the inner electrode and the outer electrode are on the same horizontal plane.

According to an embodiment of the present invention, a method is provided. The method including forming an inner electrode and an outer electrode simultaneously on a substrate, forming a phase change material layer above both the inner electrode and the outer electrode.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
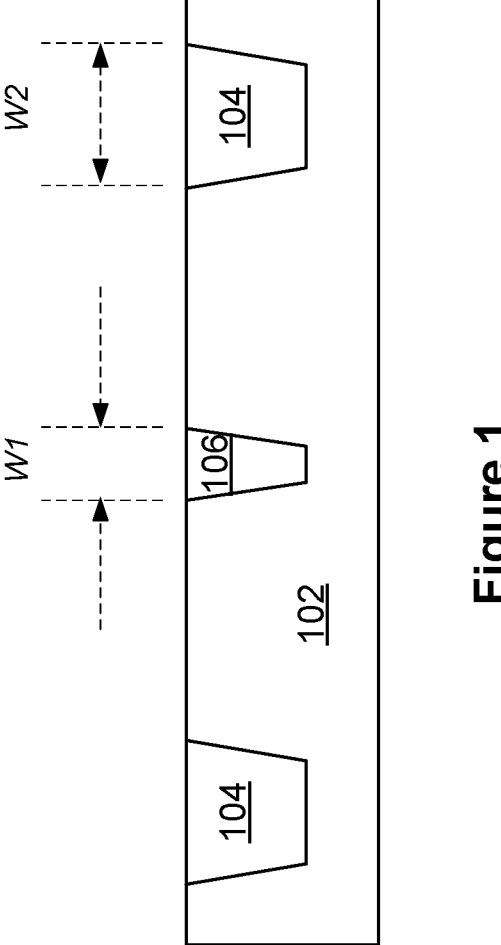
FIG. 1 illustrates a cross-sectional view of a semiconductor structure at an intermediate stage of fabrication, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention generally relate to a phase change memory cell, and more particularly, to a lateral ultrathin phase change memory cell with reduced reset current.

Phase change material memory devices rely on a high current reset operation to switch a phase change memory cell device from a low resistance crystalline state to a high resistance amorphous state. Demands of the reset operation can limit scaling of technology. There are two main techniques to reduce reset current. A first technique to reduce reset current is electrode confinement which concentrates current density/heating near an electrode. Challenges for using electrode confinement include that the heater, or inner electrode, is already sub-lithographic and shrinking further with a good yield is difficult. When forming the heater, or inner electrode, it must be patterned and then subject to a chemical mechanical planarization (CMP) technique, which can be a source of electrical variability. A second technique to reduce reset current is phase change material confinement. Phase change material confinement concentrates current density/heating in confined volume. Challenges to phase change material confinement include etching for bridge/pillar cell causes damage at active area of device and filling a confined phase change material cell via is challenging.

This invention includes a phase change material device which leverages both electrode confinement and phase change material confinement. Electrode confinement is controlled by pairing a heater, or inner electrode, with a wide outer electrode. For example, an inner electrode may have a diameter, or cross-sectional area, of less than 30 nm. Phase change material confinement is controlled by using an ultrathin phase change material layer. For example, the phase change material layer may be 10 nm.

Benefits of the invention include compatibility with current manufacturing methods, such as physical vapor deposition (PVD), elimination of reactive ion etch (RIE) damage near an active area of the phase change material device, tunable resistance which may be controlled by a thickness or height of the phase change material layer, and reduced resistance drift. Resistance drift is a challenge of phase change material devices whereby the resistance of the cell increases over time due to structural relaxation of the atoms in the amorphous material. Low-drift phase change material (PCM) devices typically have low resistivity making them too conductive for practical applications. In this invention, we can use low-drift PCMs and make them thin to make the resistance higher and thus practical. In this way, our invention can be used to lower resistance drift by enabling the use of low-resistivity, low-drift PCM materials.

Embodiments of the present invention generally relate to a phase change memory cell, and more particularly, to a lateral ultrathin phase change memory cell with reduced reset current.

Referring now to FIG. 1, a cross-sectional view of a structure 100 is shown at an intermediate step of fabrication, according to an embodiment. The structure 100 may include a substrate 102, an inner electrode 106 and an outer electrode 104.

The substrate 102 may be a silicon substrate with connections and structures, such as, for example, transistors and isolations built on it. The substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 102 may be approximately, but is not limited to, several hundred microns thick.

The inner electrode 106 and the outer electrode 104 may be formed in the substrate 102, in trenches (not shown). The inner electrode 106 and the outer electrode 104 may be formed simultaneously and at a same level or height on the substrate 102.

The inner electrode 106 and the outer electrode 104 may be blanket deposited on top of the structure 100, and directly on a top surface of the substrate 102. The inner electrode 106 and the outer electrode 104 may be formed from a conductive material layer, such as, for example, copper, tungsten, cobalt, or aluminum. The conductive material layer may be deposited using typical deposition techniques, for example, atomic layer deposition, molecular layer deposition, and chemical vapor deposition. In some cases, the conductive material layer of the inner electrode 106 and the outer electrode 104 are deposited within a trench formed in the substrate 102. In an embodiment, the inner electrode 106 and the outer electrode 104 may have a thickness ranging from about 10 nm to about 100 nm, although a thickness less than 10 nm and greater than 100 nm may be acceptable.

A width, W1, or a diameter, of the inner electrode 106 may be less than 30 nm, in an embodiment. A width, W2, of the outer electrode 104 may be between 10 and 20 nm, in an embodiment.

Layers of the substrate 102 below the structure 100 may include wiring lines and vias. In an embodiment, the inner electrode 106 may be electrically and physically connected to a ground line below the structure 100 and the outer electrode 104 may be electrically and physically connected to a voltage line below the structure 100.

Figure 2:
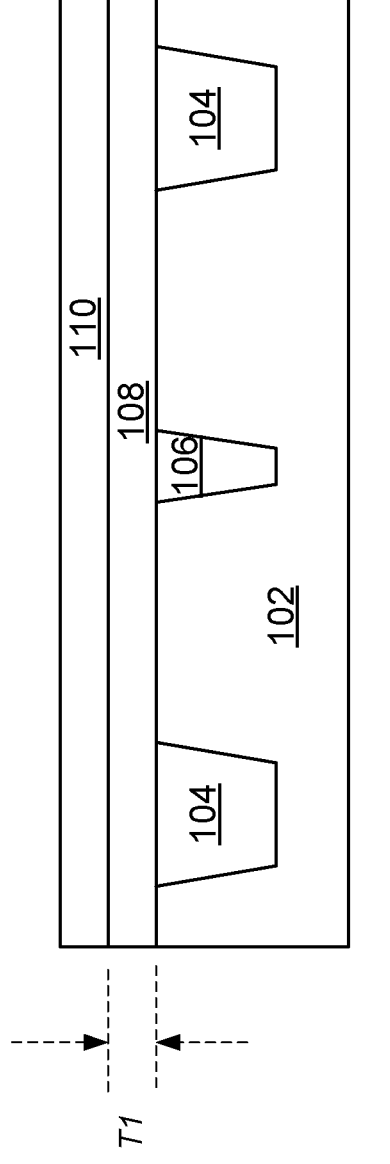
FIG. 2 illustrates a cross-sectional view of the semiconductor structure illustrating formation of a phase change material layer and a hard mask, according to an exemplary embodiment.
Figure 2:

Referring now to FIG. 2, a cross-sectional view of the structure 100 is shown, according to an embodiment. A phase change material layer 108 and a hard mask 110 may be formed.

The phase change material layer 108 may be blanket deposited on top of the structure 100, and directly on a top surface of the substrate 102, and on the conductive material of the inner electrode 106 and the outer electrode 104. Conventional deposition processes, such as electroplating, electroless plating, chemical vapor deposition, physical vapor deposition, or a combination of methods, can be used to deposit the phase change material layer 108. According to embodiments of the present invention, the phase change material layer 108 may be formed from a mixture of gallium (Ga) and antimony (Sb) and at least one of tellurium (Te), silicon (Si), germanium (Ge), arsenic (As), selenium (Se), indium (In), tin (Sn), bismuth (Bi), silver (Ag), gold (Au), and antimony (Sb). It is to be appreciated that the preceding list is merely illustrative and, thus, other elements can also be used to form the phase change material layer 108, while maintaining the spirit of the present principles disclosed herein. In an embodiment, the phase change material layer 108 may be made of a chalcogenide alloy such as germanium-antimony-tellurium (GST). According to another embodiment, the phase change material layer 108 may also be made of a transition metal oxide having multiple resistance states. For example, the phase change material layer 108 may be made of at least one material selected from the group consisting of $NiO$, $TiO_2$, $HfO$, $Nb_2O_5$, $ZnO$, $WO_3$, and $CoO$ or GST ($Ge_2Sb_2Te_5$) or PCMO ($PrxCa1-xMnO_3$). In yet another embodiment, the phase change material may be a chemical compound including one or more elements selected from the group consisting of sulfur (S), selenium (Se), tellurium (Te), arsenic (As), antimony (Sb), germanium (Ge), tin (Sn), indium (In), and silver (Ag). In an embodiment, the phase change material layer 108 may have a thickness ranging from about 8 nm to about 20 nm, although a thickness less than 8 nm and greater than 20 nm may be acceptable.

The hard mask 110 may be blanket deposited on top of the phase change material layer 108. The hard mask 110 may include any suitable barrier material known in the art, such as titanium nitride (TiN), tantalum nitride (TaN), cobalt, ruthenium, carbon (C), titanium carbide (TiC), tantalum carbide (TaC), titanium aluminium nitride (TiAlN), tantalum aluminium nitride (TaAlN), titanium aluminium carbide (TiAlC), tantalum aluminium carbon (TaAlC), hafnium nitride (HfN) or tungsten nitride (WN) either alone or in combination with other suitable barrier material.

According to the present embodiment, the hard mask 110 acts as a barrier, physically separating the phase change material layer 108 from subsequent layers formed thereon. In an embodiment, the hard mask 110 may have a thickness ranging from about 1 nm to about 30 nm, although a thickness less than 1 nm and greater than 30 nm may be acceptable.

A thickness, T1, of the phase change material layer 108 may be less than 10 nm, in an embodiment.

Figure 3:
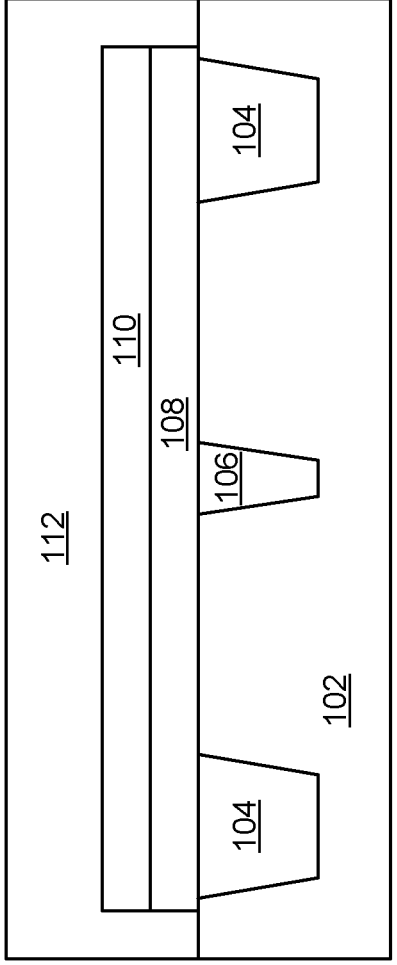
FIG. 3 illustrates a cross-sectional view of the semiconductor structure illustrating formation of an individual cell and formation of a dielectric, according to an exemplary embodiment.
Figure 3:

Referring now to FIG. 3, a cross-sectional view of the structure 100 is shown, according to an embodiment. The phase change material layer 108 and the hard mask 110 may be formed into an individual cell. A dielectric 112 may be formed.

The individual cells can be formed using patterning techniques known in the art. More specifically, portions of the phase change material layer 108 and the hard mask 110 may be selectively removed using an anisotropic etching technique, such as, for example, reactive ion etching. The individual cell may include vertically aligned portions of the phase change material layer 108 and the hard mask 110 over the inner electrode 106 and the outer electrode 104. Preferably, an upper surface of the substrate 102 is exposed as a result of patterning the aforementioned layers. Although only one individual cell is shown, it should be noted that the structure 100 would typically include an array of several thousand cells all formed according the methods disclosed herein.

The dielectric 112 can be conformally deposited across the top of the structure 100 in a blanket layer using any known deposition techniques, such as, for example, chemical vapor deposition, atomic layer deposition, physical layer deposition, or some combination thereof. More specifically, the dielectric 112 may be deposited within and generally fill the spaces between adjacent cells. The dielectric 112 may cover an upper surface of the hard mask 110, exposed upper surfaces of the substrate 102 and vertical side surfaces of the hard mask 110 and the phase change material layer 108. The dielectric 112 may include materials, such as, for example, an oxide, a nitride, or some combination thereof. In an embodiment, the dielectric 112 may include an oxide, such as, silicon oxide. In an alternate embodiment, the dielectric 112 may include a nitride, such as, silicon nitride. A chemical mechanical planarization (CMP) technique may optionally be used to polish the dielectric 112 and provide a substantially smooth and uniform surface in preparation for subsequent processing techniques.

Figure 4:
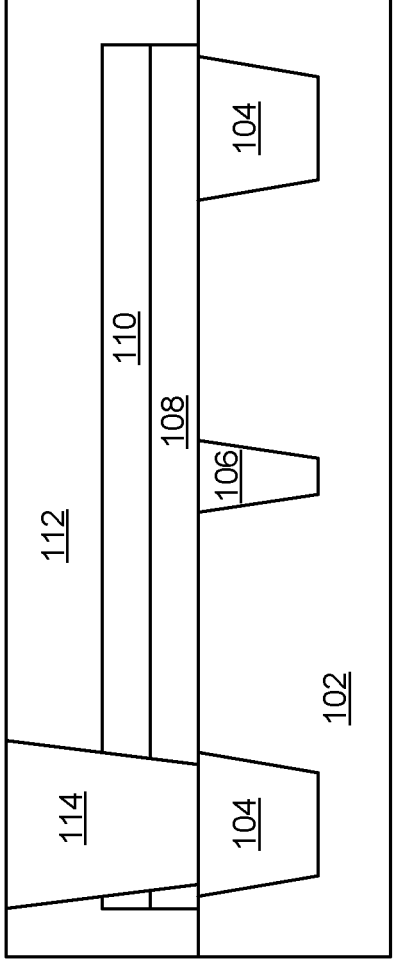
FIG. 4 illustrates a cross-sectional view of the semiconductor structure illustrating forming a contact, according to an exemplary embodiment.
Figure 4:
Figure 5:
FIG. 5 illustrates a top view of the semiconductor structure according to FIG. 4, according to an exemplary embodiment.

Referring now to FIGS. 4 and 5, the structure 100 is shown, according to an embodiment. FIG. 4 is a cross-sectional view of the structure 100 along section line A-A. FIG. 5 is a top view of the structure 100. A contact 114 may be formed.

An opening, not shown, may be formed by methods known in the art, such as a directional etch, for example an anisotropic vertical etch process such as reactive ion etch (RIE) and the contact 114 formed in the opening. The contact 114 may provide physical and electrical connection to the outer electrode 104. The contact 114 may have a liner which insulates the contact 114 from the phase change material layer 108 preventing electrical and physical connection to the phase change material layer 108.

The contact 114 may include the liner (not shown) in the opening, not shown, which may be deposited using typical deposition techniques, for example, atomic layer deposition (ALD), molecular layer deposition (MLD), chemical vapor deposition (CVD), physical vapor deposition (PVD), and spin on techniques. In an embodiment, the liner of the contact 114, not shown, may include titanium nitride (TiN) deposited using a chemical vapor deposition technique. In an embodiment, the liner of the contact 114 may include one or more layers. The liner of the contact 114 may be conformally formed on exposed surfaces of the dielectric 112. In an embodiment, the liner of the contact 114, may have a thickness, about 3 nm to 20 nm, and ranges there between, although a thickness less than 3 nm and greater than 20 nm may be acceptable.

The contact 114 may include conducting material, such as a metal. In an embodiment, the contact 114 may be tungsten (W), and may be deposited using typical deposition techniques, for example, atomic layer deposition (ALD), molecular layer deposition (MLD), chemical vapor deposition (CVD), physical vapor deposition (PVD), and spin on techniques.

As shown in FIG. 5, the dashed lines of the phase change material layer 108, which is below a surface of the structure 100, may be formed in a circular shape, in an embodiment. The dashed lines of outer edges of the outer electrode 104, which is below a surface of the structure 100, may be formed in a ring shape which surrounds the phase change material layer 108, in an embodiment. In alternative embodiments, the outer electrode 104 may be a hollow rectangular outline shape. The dashed lines of the inner electrode 106, which is below the surface of the structure 100, may be in a circular shape centered withing the outer electrode 104. In alternate embodiments, the inner electrode 106 may be a rectangular shape.

A width, W3, or diameter, of the phase change material layer 108 is shown. The width, W3, of the phase change material layer 108 may be 100 nm, in an embodiment. A distance, D1, between a center of the inner electrode 106, and a center location within the outer electrode 104, is shown. The distance, D1, may be a spacing between 60 and 120 nm. The distance, D1, may be approximately 100 nm, in an embodiment.

The structure 100 includes a phase change material device which is a lateral ultrathin phase change memory cell with a reduced reset current. The heater, or inner electrode 106 is paired with an outer electrode 104 which is significantly wider, resulting in electrode confinement which helps reduce reset current. In an embodiment, the width, W1, of the inner electrode 106 is 10 nm, while the distance between a center of the inner electrode and a center location within the outer electrode 104, which is two times D1, may be 200 nm. Additionally, a thickness of the phase change material layer, T1, may be 10 nm, which controls phase change material confinement helping to further reduce reset current of the phase change material. These aspects of the structure 100 provide a lateral ultrathin phase change memory cell with reduced reset current. Furthermore, the inner electrode 106 and the outer electrode 104 may be formed in the same horizontal plane and may be formed simultaneously.

Figure 6:
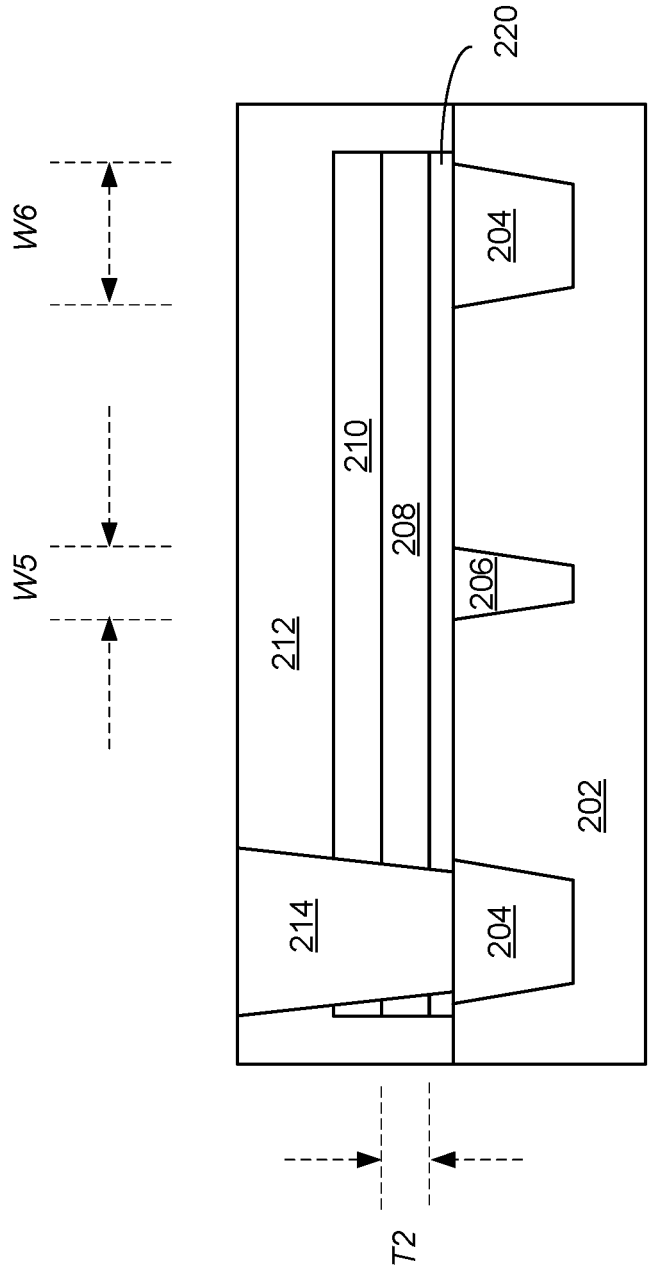
FIG. 6 illustrates a cross-sectional view of a semiconductor structure at an intermediate stage of fabrication, according to another exemplary embodiment.

Referring now to FIG. 6, a cross-sectional view of a structure 200 is shown, according to an embodiment. The structure 200 may include a substrate 202, an inner electrode 206, an outer electrode 204, a phase change material layer 208, a hard mask 210, a dielectric 212, a contact 214 and a projection liner 220.

Similarly named items of FIG. 6 may be formed as described for the structure 100, including the substrate 202, the inner electrode 206, the outer electrode 204, the phase change material layer 208, the hard mask 210, the dielectric 212 and the contact 214.

In comparison of the structure 100 and the structure 200, the projection liner 220 may be included in the structure 200. The projection liner 220 may be formed conformally on the structure 200 on the inner electrode 206, on the outer electrode 204 and on the substrate 202. The phase change material layer 208 may be conformally formed on the projection liner 220. The projection liner 220 may include one or more layers and may include a thermal barrier layer, an adhesion layer and a projection liner which reduces programming current and drift.

When forming an individual cell, the projection liner 220, portions of the phase change material layer 208 and the hard mask 210 may be selectively removed using an anisotropic etching technique, such as, for example, reactive ion etching. The individual cell may include vertically aligned portions of the projection liner 220, the phase change material layer 208 and the hard mask 210 over the inner electrode 206 and the outer electrode 204. Preferably, an upper surface of the substrate 202 is exposed as a result of patterning the aforementioned layers.

The dielectric 212 may be conformally formed on the structure 200, covering an upper surface of the hard mask 210, exposed upper surfaces of the substrate 202 and vertical side surfaces of the hard mask 210, the phase change material layer 208 and the projection liner 220.

The contact 214 may provide physical and electrical connection to the outer electrode 204. The contact 214 may have a liner which insulates the contact 214 from the phase change material layer 108 and from the projection liner 220, preventing electrical and physical connection to the phase change material layer 208.

A width, W5, or a diameter, of the inner electrode 206 may be less than 30 nm, in an embodiment. A distance, between a center of the inner electrode 206 and a center line of the outer electrode 204, may be between 10 and 20 nm, in an embodiment. A thickness, T2, of the phase change material layer 208 may be less than 10 nm, in an embodiment.

The structure 200 includes an additional embodiment of a phase change material device which is a lateral ultrathin phase change memory cell with a reduced reset current. The heater, or inner electrode 206 is paired with an outer electrode 204 which is significantly wider, resulting in electrode confinement which helps reduce reset current. In an embodiment, the width, W5, of the inner electrode 206 is 10 nm, while a distance between the center of the inner electrode 206 and a center line of the outer electrode 204 may be 200. Additionally, a thickness of the phase change material layer, T2, may be 10 nm, which controls phase change material confinement helping to further reduce reset current of the phase change material. These aspects of the structure 200 provide a lateral ultrathin phase change memory cell with reduced reset current. Furthermore, the inner electrode 206 and the outer electrode 204 may be formed in the same horizontal plane and may be formed simultaneously. In alternative embodiments, the inner electrode 206 may be shaped circular or rectangular. In alternative embodiments, the outer electrode 204 may be ring shaped or a hollow rectangular outline shape.

Figure 7:
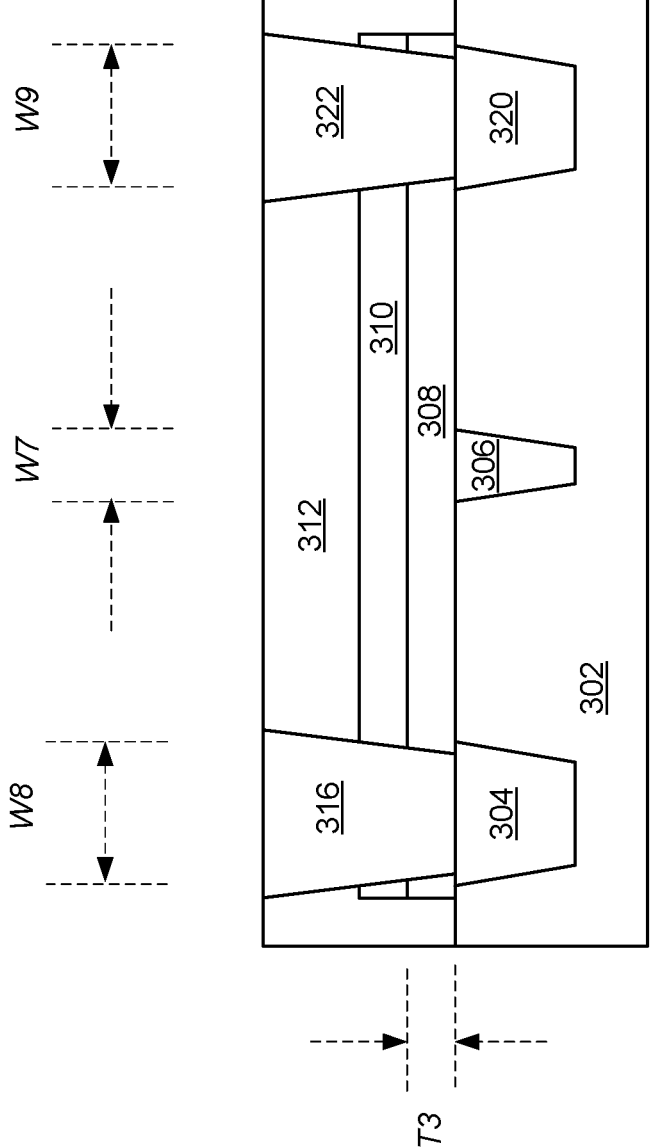
FIG. 7 illustrates a cross-sectional view of a semiconductor structure at an intermediate stage of fabrication, according to another exemplary embodiment.
Figure 7:
Figure 8:
FIG. 8 illustrates a top view of the semiconductor structure according to FIG. 7, according to an exemplary embodiment.

Referring now to FIGS. 7 and 8, a structure 300 is shown, according to an embodiment. FIG. 7 is a cross sectional view along section line B-B. FIG. 8 is a top view. The structure 300 may include a substrate 302, an inner electrode 306, a first outer electrode 304, a second outer electrode 320, a phase change material layer 308, a hard mask 310, a dielectric 312, a first contact 314 and a second contact 322.

Similarly named items of FIGS. 7 and 8 may be formed as described for the structure 100, including the substrate 302, the inner electrode 306, the first outer electrode 304, the second outer electrode 320, the phase change material layer 308, the hard mask 310, the dielectric 312, the first contact 314 and the second contact 322.

In comparison of the structure 100 and the structure 300, rather than a single outer electrode, specifically the outer electrode 104, the structure 300 has the first outer electrode 304 and the second outer electrode 320. Additionally, rather than the single contact 314, the structure 300 has the first contact 314 and the second contact 322.

The first outer electrode 304 and the second outer electrode 320 may each be formed as described for the outer electrode 104. The first outer electrode 304 and the second outer electrode 320 may be electrically and physically separate from each other and may each be rectangular shaped when viewed from above as shown in FIG. 8. Alternatively, the first outer electrode 304 and the second outer electrode 320 may be circular or oval. The first outer electrode 304 and the second outer electrode 320 may each be connected to a power supply in buried layers beneath the structure 300.

The first contact 314 and the second contact 322 may each be formed as described for the contact 114. The first contact 314 may be physically and electrically connected to the first outer electrode 304. The second contact 322 may be physically and electrically connected to the second outer electrode 320. The first contact 314 and the second contact 322 may each have a liner to insulate each from the phase change material layer 308, preventing electrical and physical connection to the phase change material layer 308.

In an additional embodiment, there may be a projection liner formed on the structure 300 on the inner electrode 306, on the first outer electrode 304, on the second outer electrode 320 and on the substrate 302. In this embodiment, the phase change material layer 308 may be conformally formed on the projection liner. The projection liner may include one or more layers and may include a thermal barrier layer, an adhesion layer and a projection liner which reduces programming current and drift.

A width, W7, or diameter, of the inner electrode 306 may be less than 30 nm, in an embodiment. A width, W8, and a width, W9, of the first outer electrode 304 and the second outer electrode 320, respectively, may be between 10 and 20 nm, in an embodiment. A thickness, T3, of the phase change material layer 308 may be less than 10 nm, in an embodiment.

A width, W10, or diameter, of the phase change material layer 308 is shown. The width, W10, of the phase change material layer 308 may be 100 nm, in an embodiment. As shown, the phase change material layer 308 may be formed in a rectangular shape. Alternatively, the phase change material layer 308 may be in a circular shape. A distance, D2, between a center location of the inner electrode 306, and a center location within the first outer electrode 304, and between the inner electrode 306 and the second outer electrode 320, is shown. The distance, D2, may be a spacing between 60 and 120 nm. The distance, D2, may be approximately 100 nm, in an embodiment.

The structure 300 includes an additional embodiment of a phase change material device which is a lateral ultrathin phase change memory cell with a reduced reset current. The heater, or inner electrode 306 is paired with a first outer electrode 304 and a second outer electrode 320 which are spaced significantly wider than the inner electrode 306, resulting in electrode confinement which helps reduce reset current. In an embodiment, the width, W7, of the inner electrode 306 is 10 nm, while a spacing between the first outer electrode 304 and the second outer electrode 320 may be two times D2 and may be 200 nm. Additionally, a thickness of the phase change material layer, T3, may be 10 nm, which controls phase change material confinement helping to further reduce reset current of the phase change material. These aspects of the structure 300 provide a lateral ultrathin phase change memory cell with reduced reset current. Furthermore, the inner electrode 306, the first outer electrode 320 and the second outer electrode 320 may be formed in the same horizontal plane and may be formed simultaneously.

Figure 9:
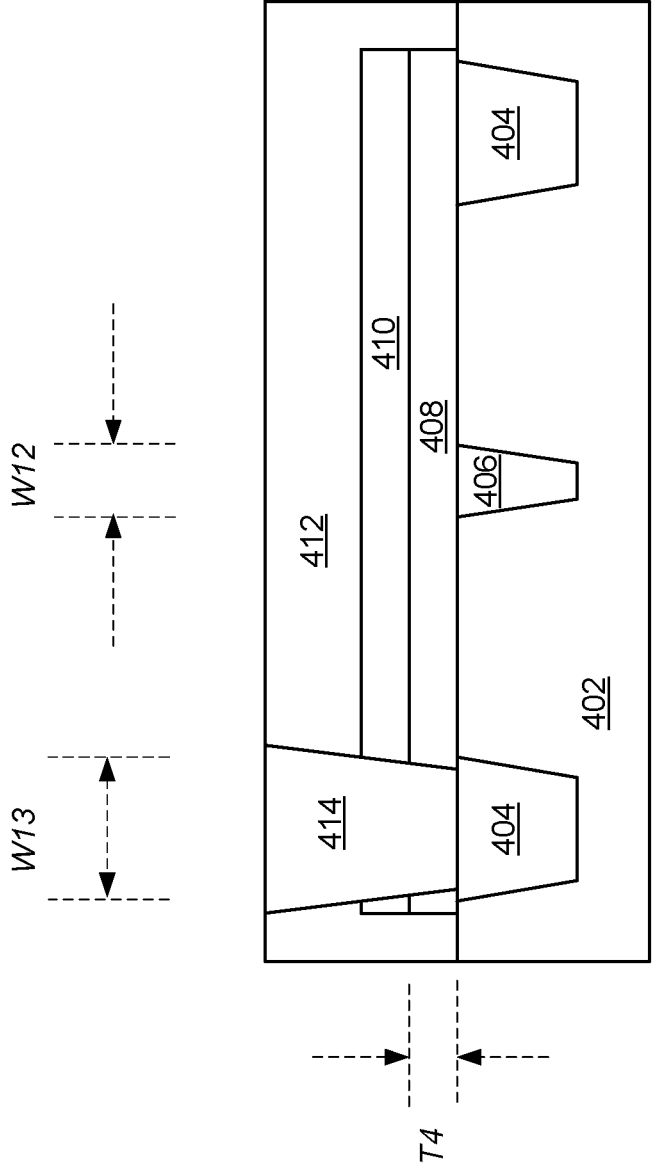
FIG. 9 illustrates a cross-sectional view of a semiconductor structure at an intermediate stage of fabrication, according to another exemplary embodiment.
Figure 9:
Figure 10:
FIG. 10 illustrates a top view of the semiconductor structure according to FIG. 9, according to an exemplary embodiment.

Referring now to FIGS. 9 and 10, a structure 400 is shown, according to an embodiment. FIG. 9 is a cross sectional view along section line C-C. FIG. 10 is a top view. The structure 400 may include a substrate 402, an inner electrode 406, an outer electrode 404, a phase change material layer 408, a hard mask 410, a dielectric 412 and a contact 414.

Similarly named items of FIGS. 9 and 10 may be formed as described for the structure 100, including the substrate 402, the inner electrode 406, the outer electrode 404, the phase change material layer 408, the hard mask 410, the dielectric 412 and the contact 414.

In comparison of the structure 100 and the structure 400, a shape of the outer electrode 404 may be rectangular, or square, rather than circular, as seen from above in FIG. 10.

In an additional embodiment, there may be a projection liner formed on the structure 400 on the inner electrode 406, on the outer electrode 404 and on the substrate 402. In this embodiment, the phase change material layer 408 may be conformally formed on the projection liner. The projection liner may include one or more layers and may include a thermal barrier layer, an adhesion layer and a projection liner which reduces programming current and drift.

A width, W12, or diameter, of the inner electrode 406 may be less than 30 nm, in an embodiment. A width, W13, of the outer electrode 404 may be between 10 and 20 nm, in an embodiment. A thickness, T4, of the phase change material layer 408 may be less than 10 nm, in an embodiment.

A width, W13, or diameter, of the phase change material layer 408 is shown. The width, W13, of the phase change material layer 408 may be 100 nm, in an embodiment. As shown in FIG. 10, the phase change material layer 408 is a rectangular shape. Alternatively, the phase change material layer 408 may be a circular shape. A distance, D3, between a center location of the inner electrode 406, and a center location within the outer electrode 404, is shown. The distance, D3, may be a spacing between 60 and 120 nm. The distance, D3, may be approximately 100 nm, in an embodiment. As shown in in FIG. 10, the outer electrode 404 is a hollow rectangular outline shape. Alternatively, the outer electrode 404 may be a ring shape.

The structure 400 includes an additional embodiment of a phase change material device which is a lateral ultrathin phase change memory cell with a reduced reset current. The heater, or inner electrode 406 is paired with an outer electrode 404 with a significantly wider diameter than the inner electrode 406, resulting in electrode confinement which helps reduce reset current. In an embodiment, the width, W12, of the inner electrode 406 is 10 nm, while a diameter of the outer electrode 404 may be two times D3 and may be 200 nm. Additionally, a thickness of the phase change material layer, T4, may be 10 nm, which controls phase change material confinement helping to further reduce reset current of the phase change material. These aspects of the structure 400 provide a lateral ultrathin phase change memory cell with reduced reset current. Furthermore, the inner electrode 406 and the outer electrode 404 may be formed in the same horizontal plane and may be formed simultaneously.

The different embodiment of the structure 100, the structure 200, the structure 300 and the structure 400 demonstrate variations of forming a phase change material device which is a lateral ultrathin phase change memory cell with a reduced reset current.

Furthermore, the inner electrode 406 and the outer electrode 404 may be formed in the same horizontal plane and may be formed simultaneously.

According to an alternative embodiment, the phase change material layer of each of the embodiments may alternatively include a material suitable for an alternative type of non-volatile memory cell such as resistive random access memory (ReRAM), conductive bridging random access memory (CBRAM) or ferroelectric tunnel junction (FTJ). For ReRAM, metal oxides, such as hafnium oxide, tantalum oxide, titanium oxide, aluminum oxide, silicon oxide, are typically used and oxygen vacancies in the oxide serve as building block of switching filament. For CBRAM, metal cations, such as copper, silver, and mixture thereof are used instead of oxygen vacancies. For FTJ, hafnium based ferroelectric films are used for the switching layer, for example hafnium oxide and hafnium oxide with dopants such as aluminum, zirconium, silicon, nitrogen, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
    an inner electrode and an outer electrode on a substrate, wherein the inner electrode and the outer electrode are located on the same level, wherein the substrate extends laterally between the inner electrode and the outer electrode; and
    a phase change material layer, the phase change material layer vertically aligned above both the inner electrode and the outer electrode, wherein the phase change material extends laterally over the inner electrode and the outer electrode.

2. The structure according to claim 1, wherein the inner electrode and the outer electrode are on the same horizontal plane.

3. The structure according to claim 1, wherein a lateral diameter of the inner electrode is five times less than a lateral diameter of the outer electrode.

4. The structure according to claim 1, wherein the outer electrode is in a circular shape surrounding the inner electrode.

5. The structure according to claim 2, further comprising:

a contact to the outer electrode, wherein the contact is formed through the phase change material layer.

6. The structure according to claim 1, wherein the phase change material layer comprises a thickness of 10 nm.

7. The structure according to claim 1, further comprising:

a projection liner below the phase change material layer and above both the inner electrode and the outer electrode.

8. The structure according to claim 1, further comprising:

a second outer electrode on the same horizontal plane as the inner electrode and the outer electrode.

9. A structure comprising:

an inner electrode and an outer electrode on a substrate, wherein the inner electrode and the outer electrode are on the same horizontal plane, wherein the substrate extends laterally between the inner electrode and the outer electrode on the same horizontal plane; and a phase change material layer, the phase change material layer vertically aligned above both the inner electrode and the outer electrode, wherein the phase change material extends laterally over the inner electrode and the outer electrode.

10. The structure according to claim 9, wherein a lateral diameter of the inner electrode is five times less than a lateral diameter of the outer electrode.

11. The structure according to claim 9, wherein the outer electrode is in a circular shape surrounding the inner electrode.

12. The structure according to claim 9, further comprising:

a contact to the outer electrode, wherein the contact is formed though the phase change material layer.

13. The structure according to claim 9, wherein the phase change material layer comprises a thickness of 20 nm.

14. The structure according to claim 13, further comprising:

a second outer electrode on the same horizontal plane as the inner electrode and the outer electrode.

*　*　*　*　*